United States Patent
Peng et al.

(10) Patent No.: US 7,022,597 B2
(45) Date of Patent: Apr. 4, 2006

(54) METHOD FOR MANUFACTURING GALLIUM NITRIDE BASED TRANSPARENT CONDUCTIVE OXIDIZED FILM OHMIC ELECTRODES

(75) Inventors: Lung-Han Peng, Taipei (TW); Han-Ming Wu, Taoyuan (TW); Sung-Li Wang, Taipei (TW); Chia-Wei Chang, Kaohsiung (TW); Chin-Yi Lin, Yunlin (TW)

(73) Assignee: Tekcore Co., Ltd., Nantou (TW)

( * ) Notice: Subject to any disclaimer, the term of this patent is extended or adjusted under 35 U.S.C. 154(b) by 0 days.

(21) Appl. No.: 10/892,180

(22) Filed: Jul. 16, 2004

(65) Prior Publication Data

US 2006/0014368 A1    Jan. 19, 2006

(51) Int. Cl.
*H01L 21/44* (2006.01)
(52) U.S. Cl. .................. 438/604; 438/94; 438/47; 438/172
(58) Field of Classification Search ............. 438/604, 438/602, 603, 20, 30, 46, 47, 77, 92, 93, 438/94, 172, 235, 191, 194, 311, 312, 309, 438/369, 378, 491, 487, 488, 796
See application file for complete search history.

(56) References Cited

U.S. PATENT DOCUMENTS

| | | | |
|---|---|---|---|
| 5,563,422 A | 10/1996 | Nanji et al. ............. 257/13 |
| 5,644,156 A * | 7/1997 | Suzuki et al. ........... 257/485 |
| 6,608,360 B1 * | 8/2003 | Starikov et al. ........ 257/481 |
| 6,620,643 B1 | 9/2003 | Koike ..................... 438/30 |
| 6,803,603 B1 * | 10/2004 | Nitta et al. ............. 257/79 |
| 6,881,979 B1 * | 4/2005 | Starikov et al. ........ 257/80 |

OTHER PUBLICATIONS

Song, et al. "Highly low resistance and transparent Ni/ZnO ohmic contacts to p-type GaN", Applied Physics Letters, Jul. 21, 2003, pp. 479-481, vol. 83, No. 3.
Kim, et al. "Effect of an indium-tin-oxide overlayer on transparent Ni/Au ohmic contact on p-type GaN", Applied Physics Letters, Jan. 6, 2003, pp. 61-63, vol. 82, No. 1.
Horng, et al. "Low-resistance and high-transparency Ni/indium tin oxide ohmic contacts to p-type GaN", Applied Physics Letters, Oct. 29, 2001, pp. 2925-2927, vol. 79, No. 18.

(Continued)

*Primary Examiner*—David Nhu
(74) *Attorney, Agent, or Firm*—Birch, Stewart, Kolasch & Birch, LLP

(57) ABSTRACT

A method for manufacturing gallium nitride based transparent conductive oxidized film ohmic electrodes includes forming a transparent conductive film on a GaN layer, forming a transparent conductive hetero-junction of opposing electrical characteristics on a transparent conductive film on the surface of the GaN layer through an ion diffusion process, and laying a metallic thick film on the surface of the transparent conductive hetero-junction for wiring process in the later fabrication operation. Thus through the electron and hole tunneling effect in the ion diffusion process the Fermi level of the hetero-junction may be improved to form an ohmic contact electrode.

7 Claims, 7 Drawing Sheets

OTHER PUBLICATIONS

Lee et al. "Ohmic contact formation mechanism of nonalloyed Pd contacts to p-type GaN observed by positron annihilation spectroscopy", Applied Physics Letters, Apr. 19, 1999, pp. 2289-2291, vol. 74, No. 16.

Ho et al. "Low-resistance ohmic contacts to p-type GaN", Applied Physics Letters, Mar. 1, 1999, pp. 1275-1277, vol. 74, No. 9.

Jang et al. "Mechanism for ohmic contact formation of oxidized Ni/Au on p-type GaN", Journal of Applied Physics, Aug. 1, 2003, pp. 1748-1752, vol. 94, No. 3.

Jang et al. "Transparent ohmic contacts of oxidized Ru and Ir on p-type GaN", Journal of Applied Physics, May 1, 2003, pp. 5416-5421, vol. 93, No. 9.

Motayed et al. "High-Transparency Ni/Au bilayer contacts to n-type GaN", Journal of Applied Physics, Nov. 1, 2002, pp. 5218-5227, vol. 92, No. 9.

* cited by examiner

METHOD FOR MANUFACTURING GALLIUM NITRIDE BASED TRANSPARENT CONDUCTIVE OXIDIZED FILM OHMIC ELECTRODES

FIELD OF THE INVENTION

The present invention relates to a method for manufacturing transparent conductive oxidized film ohmic electrodes and particularly to a method for forming conductive oxidized film ohmic electrodes on a gallium nitride (GaN) layer through an ion diffusion process.

BACKGROUND OF THE INVENTION

GaN group compounds have direct bandgap (Eg) in the ultraviolet and Blue/Green light wave band, and hence may be used as highly efficient sources of white light and visible light. At present, commercialized products have blue, green, ultraviolet and white light-emitting diode (White LED) and laser diode (LD) in the blue and violet light wave band. The energy level of GaN group compounds have high electron affinity ($\chi$). Take GaN for instance, Eg=3.4 eV, $\chi$=2.9 eV. Hence when forming metal contact electrodes, especially p-type GaN based ohmic contact electrodes, metals of a high work function ($\phi_m$) must be used, such as Nickel (Ni) ($\phi_m$=5.15 eV), Gold (Au) ($\phi_m$=5.1 eV), Palladium (Pd) ($\phi_m$=5.12 eV), Platinum (Pt) ($\phi_m$=5.65 eV), Ruthenium (Ru), Iridium (Ir), and the like. Hole injection is performed from the metal electrode to the p-type GaN. For instance, U.S. Pat. No. 5,563,422, assigned to Nichia Chemical Industries, Ltd., discloses a technique which uses Ni/Au/p-GaN as the contact electrode of p-GaN, and forms a transparent conductive film through an annealing process at a temperature higher than 400° C. Another technique is disclosed in U.S. Pat. No. 6,620,643 (Sep. 6, 2003), assigned to Toyoda Gosei., Ltd. It uses Au/Co/p-GaN as the contact electrode of p-GaN.

The mechanism of the high work function metal being able to form p-GaN ohmic contact after annealing is explained in an article published by H. W. Jang et al, entitled "Mechanism for ohmic contact formation of oxidized Ni/Au on p-type GaN," Journal of Applied Physics vol. 94, No. 3, pp. 1748–1752 (Aug. 1, 2003). In the oxidation process at high temperature, take an Au/Ni/GaN interface as an example, the high temperature causes Ni to be diffused and form a p-type transparent conductive film NiO/Au/GaN on the surface of GaN. On the interface, not only Ga is melted in Au (for example, at 409° C. atoms of the low melting point Ga has a meltability of 13% in Au). The remained atoms of Ga on the interface state still have reactions with oxygen to form Gallium Oxide ($Ga_2O_3$). It is further understood that the atoms of Ga on the interface are melted and oxidized to form changes of the interface state. According to the research done by J. L. Lee et al (Applied Physics Letters vol. 74, 2289 (1999)). (1) It is not only Ga vacancy formed on the interface, that is equivalent to forming acceptors on the p-GaN interface, thus providing extra electron hole concentration on the p-GaN surface. Meanwhile, according to the research done by A. Motayed et al. "High-transparency Ni/Au bilayer contacts to n-type GaN," Journal of applied physics vol. 92, no. 9, pp. 5218–5227 (Nov. 1, 2002). (2) The surface work function ($\phi_m$) may also decrease. Based on the reasons (1) and (2) set forth above, with the GaN surface condition changed, Fermi level on the GaN surface may be improved to facilitate forming of ohmic contact electrodes with NiO.

However, research done by H. W. Jang et al. "Transparent ohmic contacts of oxidized Ru and Ir on p-type GaN," Journal of applied physics vol. 93, no. 9, pp. 5416–5418 (May 1, 2003) indicates that the thermal stability of the electrode formed by Ni/Au/GaN is not desirable. For instance, after having been annealed at 500° C. for 24 hours, the resistance of Ni/Au increases 840 times. Moreover, Au has strong absorption at the visible wave band. For fabricating Blue/Green light LEDs, a super thin Au film (5–10 nm) has to be used for the transparent conductive layer. Hence the present technology development of p-GaN ohmic contact electrodes mainly focuses on non-Au electrodes.

Recently published techniques include:
(1) n:ITO/Au/Ni/p-GaN (S. Y. Kim et al., "Effect of an indium-tin-oxide overlayer on transparent Ni/Au ohmic contact on p-type GaN," Applied Physics Letters, vol. 82, No. 1, pp. 61–63, (Jan. 6, 2003), and
(2) Al:ZnO/Ni/p-GaN (J. O. Song et al., "Highly low resistance and transparent Ni/ZnO ohmic contacts to p-type GaN," Applied Physics Letters vol. 83, No. 3, pp. 479–481 (Jul. 21, 2003).

The techniques set forth above use respectively the following transparent oxidized films that are stacked to form ohmic contact electrodes with p-GaN: ITO (60 nm)/Au (3 nm)/Ni (2 nm)/p-GaN (annealed at 500° C.); and AZO (450 nm)/Ni (5 nm)/p-GaN (annealed at 550° C.).

The two techniques mentioned above have commonly adopted a n-type transparent conductive oxide film of a high work function ($\phi_m$>4 eV), such as $Sn:In_2O_3$ (ITO), Al:ZnO (AZO), and is stacked top to tail on top of each other with a p-type transparent conductive oxide film NiO of a proximate work function ($\phi_m$=5 eV) to form an ohmic contact with a semiconductor (such as GaN) which has high electron affinity. This is a work function engineering concept. Namely, use two n/p-type transparent oxide films of proximate work function to couple with a wide bandgap material (such as GaN) to form an ohmic contact.

The p-GaN electrode is made by Indium Tin Oxide (ITO) and Zinc Oxide which adopts aluminum (AZO) are stacking with the Nickel Oxide (NiO) has two limitation:
(1) The difference of work function among ITO, AZO and NiO ranges from 0.3 to 0.5 eV.
(2) The absorption bandgap values of ITO, AZO and NiO are about 3.6 eV, which is proximate to GaN.

The first limitation (1) will boost the forward voltage of the GaN LED by 1~5 V. The second limitation (2) will result in a lower penetration rate of the ultra-violet light when those two oxide films are stacked. As a result, the external efficiency of the short wavelength drops.

For instance, a:ITO(250 nm)/Ni(10 nm)/p-GaN and b:Au (5 nm)/Ni(10 nm) will have the penetration rate dropping to 55% at 350 nm○(Reference for a can be found in: R.-H. Horng et al., "Low-resistance and high-transparency Ni/ITO ohmic contacts to p-type GaN," Applied Physics Letters, vol. 79, no. 18, pp. 2925–2927 (Oct. 29, 2001)○Reference for b can be found in: J. K. Ho et al., "Low resistance ohmic contact to p-type GaN," Applied Physics Letters vol. 74, no. 9, pp. 1275–1277 (Mar. 1, 1999).

SUMMARY OF THE INVENTION

Therefore the invention aims to resolve the aforesaid disadvantages occurring in with conventional techniques. The primary object of the invention is to overcome the disparity between work functions of the present conductive oxide films (ITO and AZO) and NiO/GaN that results in an undesirable operating voltage.

Another object of the invention is to resolve the absorption problem occurring with the oxide film in the ultra-violet spectrum (wavelength <360 nm).

In order to achieve the foregoing objects, the method of the invention includes forming a transparent conductive film on a GaN layer, forming a transparent conductive heterojunction of opposing electric characteristics of transparent conductive films on the surface of the GaN layer through ion diffusion, and laying a metallic thick film on the surface of the transparent conductive hetero-junction for wiring processes in the later fabrication operation. Thus through the electron and hole tunneling effect of the ion diffusion process to form an ohmic contact electrode on the hetero-junction.

The foregoing, as well as additional objects, features and advantages of the invention will be more readily apparent from the following detailed description, which proceeds with reference to the accompanying drawings.

TABLE

Work function of transparent conductive oxide films

|  | $Ga_2O_3$ | $Sn:In_2O_3$ | $Al:ZnO$ | $NiO$ |
|---|---|---|---|---|
| Bandgap value Eg (eV) | 4.9 | 3.6 | 3.2 | 4 |
| Work function $\phi_m$ (eV) | 5.0 | 4.7 | 4.5 | 5.0 |

DETAILED DESCRIPTION OF THE PREFERRED EMBODIMENTS

The table depicted above shows a selected number of n-type transparent conductive oxide films fabricated by sputtering that have high work functions and high bandgap values. Compared with the commonly used p-type NiO conductive oxide film, $Ga_2O_3$ has the same work function ($\phi_m$=5 eV) as NiO, and a highest bandgap value (Eg=4.9 eV) among the selected oxide films. Hence it may be adopted for use on LED at the spectrum as short as 250 nm.

Figure 1:
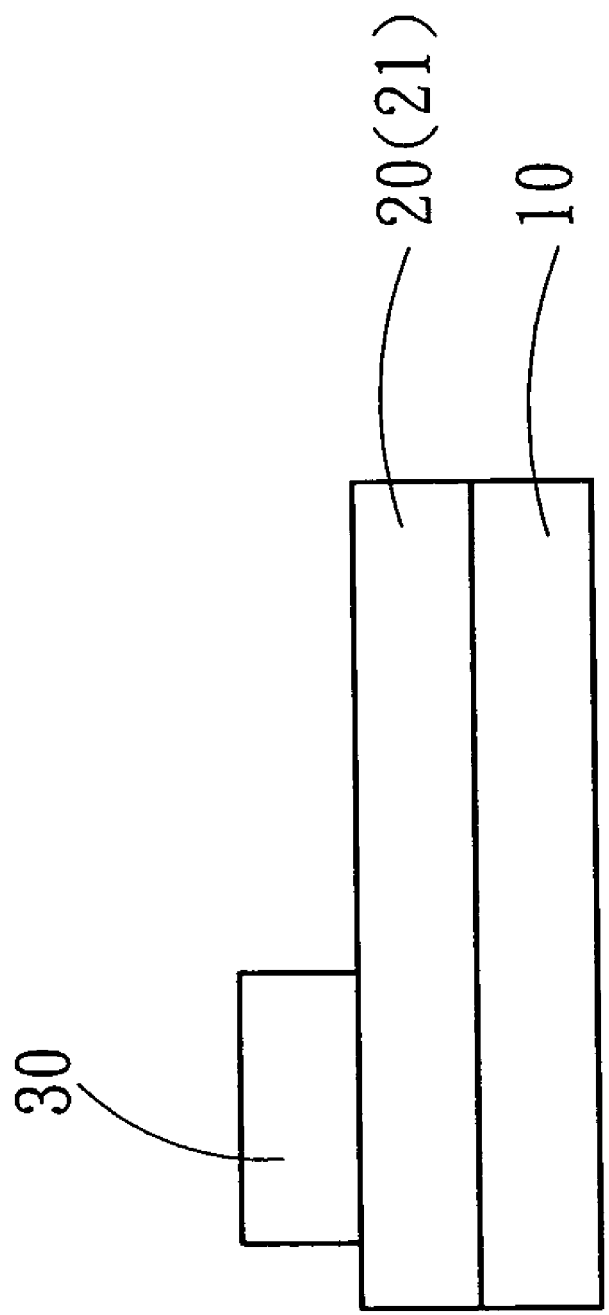
FIG. 1 is a schematic view of a GaN conductive electrode according to the present invention.

Please refer to FIG. 1 for a technique on forming an ohmic contact electrode according to the invention. The embodiment is a GaN conductive electrode. On a GaN layer 10, a transparent conductive film 20 is formed. The main processing steps and techniques are as follows:

(a) First, fabricate a GaN layer 10, then form a transparent conductive film 20 on the surface of the GaN layer 10 that has a high work function. The transparent conductive film 20 with high work function is made from materials selected from the group consisting of $Ga_2O_3$, $In_2O_3$, $Al_2O_3$ or combinations thereof.

(b) Form a transparent conductive heterojunction 21 of opposing electrical poles on the transparent conductive film 20 through an ion diffusion process that is laid on the surface of the GaN layer 10. The hetero-junction 21 laid on the surface of the GaN layer 10 is formed from the $n^+/p$ transparent conductive film 20 which has the same work function. The ion diffusion process may adopt ion plantation or diffusion at high temperature with mixed substances. The ions used in the ion diffusion process may be a p-type mixture selecting from the group consisting of zinc (Zn), nickel (Ni), cobalt (Co), beryllium (Be), magnesium (Mg), calcium (Ca), strontium (Sr), barium (Ba), and silver (Ag).

(c) Lay a metallic thick film 30 on the surface of the transparent conductive hetero-junction 21 for the wiring process in the later fabrication operation. The metallic thick film 30 may be selected from monoxide films made from titanium (Ti), aluminum (Al), nickel (Ni), gold (Au) or combinations thereof.

Thus through the electron and hole tunneling effect in the ion diffusion process described above the hetero-junction 21 may form an ohmic contact electrode.

The concept of junction formed by tunneling $n^+/p$ or $p^+/n$ was adopted since 1960s for fabricating Si, Ge or GaAs ohmic contact electrodes. It also was adopted in GaAs LD technology in 1990s, and also was adopted in GaN LED technology in 2001. However, in GaN LED techniques, the tunneling electrode is limited to $n^+/p$ semiconductor homo-junction at present. The technique of forming tunneling hetero-junction through a transparent conductive oxide film is first introduced by the present invention.

The effect of the invention is elaborated through embodiments depicted as follows:

Embodiment 1

Figure 2:
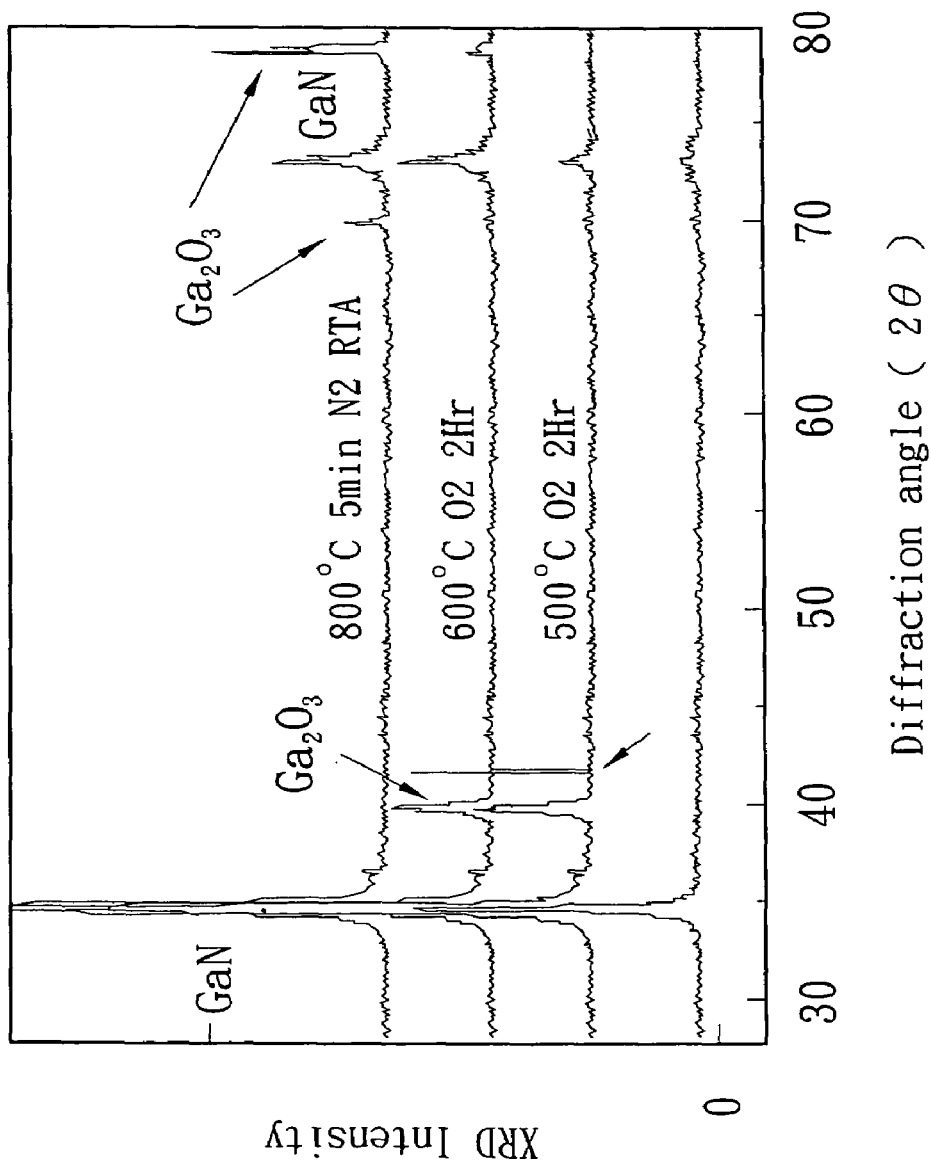
FIG. 2 is a photo showing an X-ray diffraction of a first embodiment of the present invention.
Figure 3:
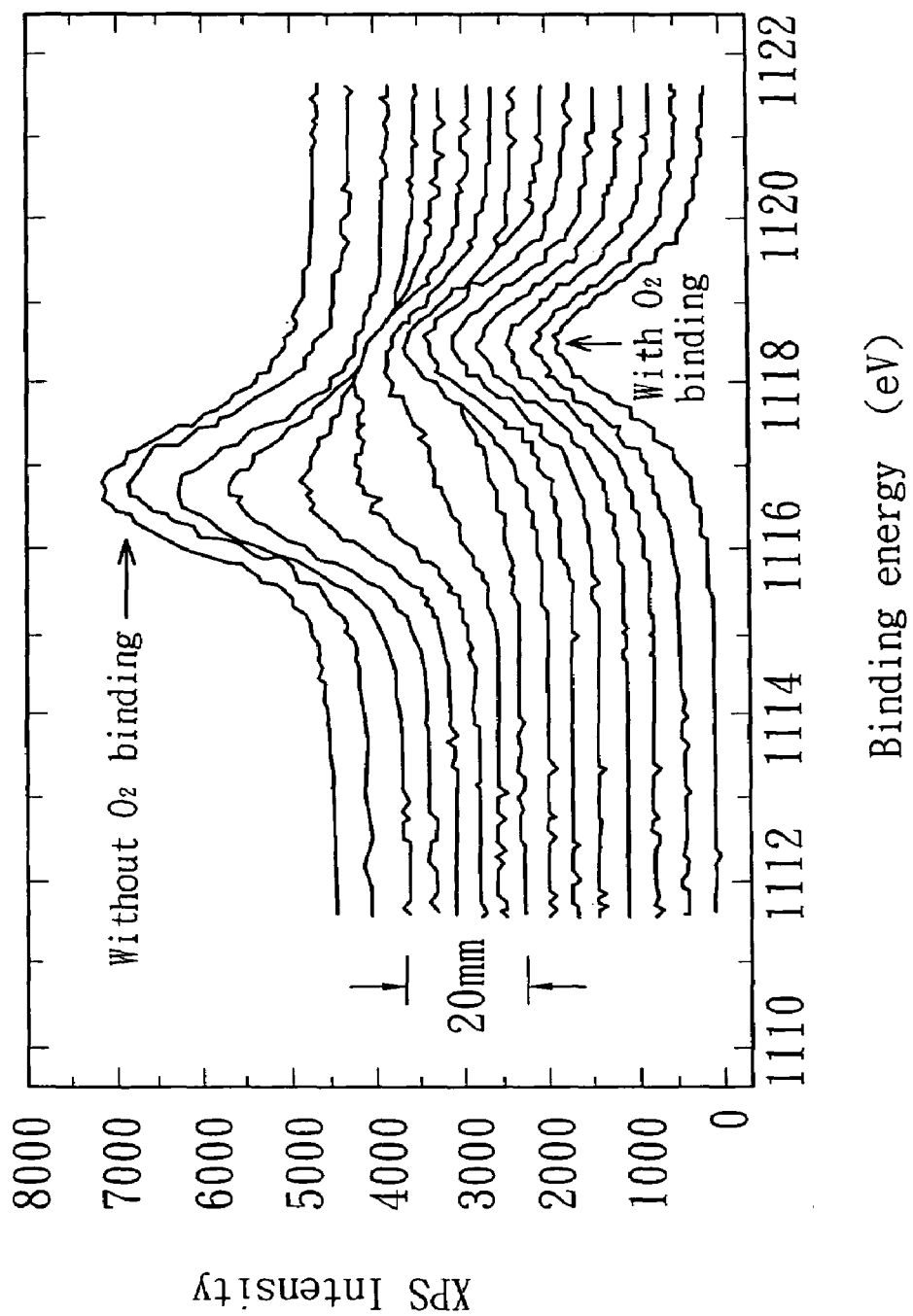
FIG. 3 is a schematic chart showing a GaN interface of the first embodiment of the present invention.

In a N-type GaN structure, first, oxidize the surface of the n-type GaN anodizing through a photoelectric chemical process to form $Ga_2O_3$ doping with Si. After annealing at a desired phase transformation temperature, different phases of $Ga_2O_3$ may be obtained. Under X-ray diffraction (XRD) photography, it shows that crystalline $Ga_2O_3$ is grown on the sample surface (referring to FIG. 2). After Computed Tomography analysis (CT scan analysis) through X-ray photoelectron emission spectroscopy (XPS), it is found that in addition to growing $Ga_2O_3$, a graded layer of GaON at a thickness about 20 nm also is formed on the GaN junction (referring to FIG. 3). Through the graded layer and applying ion implantation or impurity diffusion technique, electrical characteristics and surface work functions at the junction may be altered. (Formation of the graded layer is an important technique for forming the tunnel junction. More details of applications will be discussed in embodiments 2 and 3 below).

Embodiment 2

Figure 4:
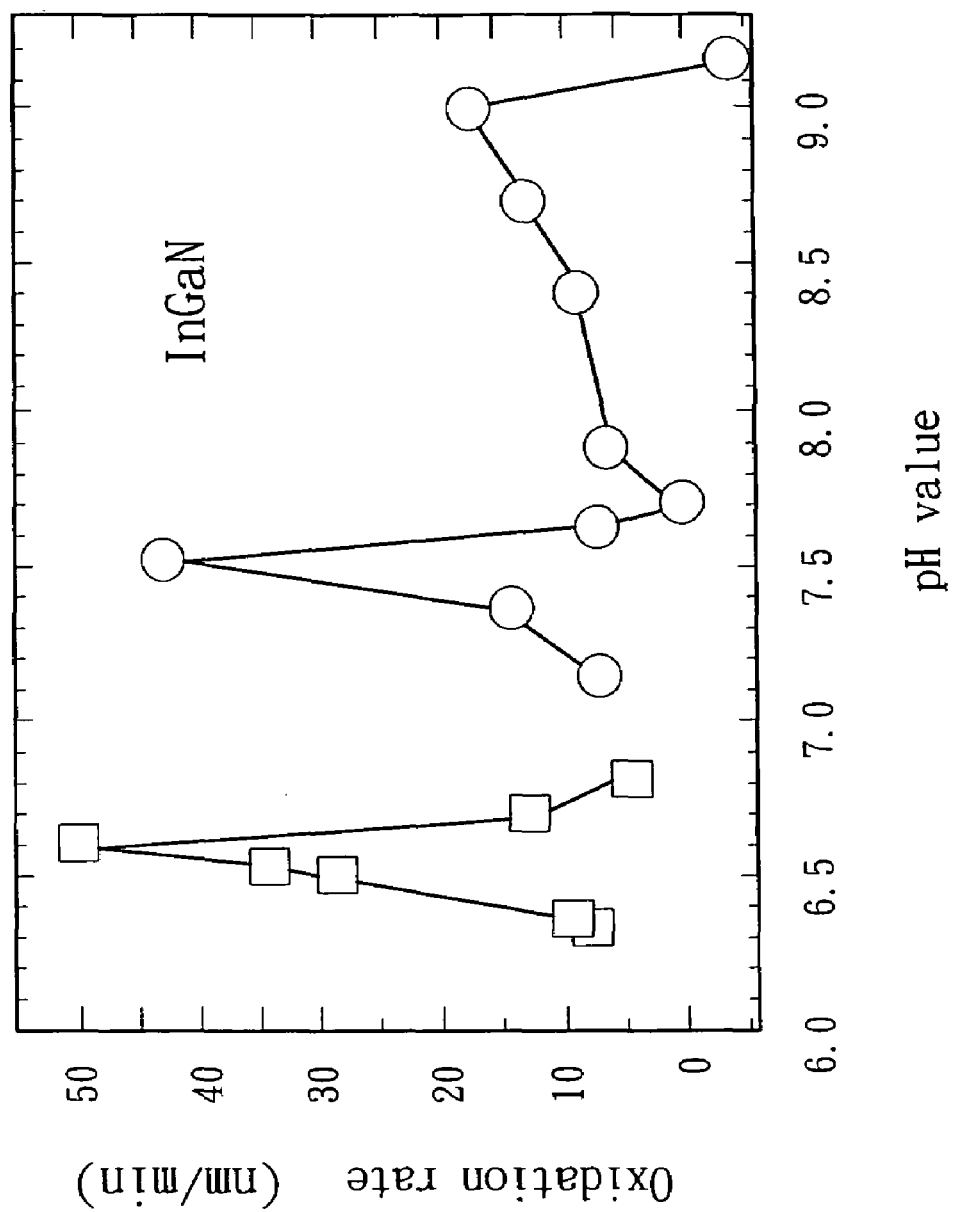
FIG. 4 is a chart of a second embodiment of the invention showing the relationship of the growth rate and the pH value.
Figure 5:
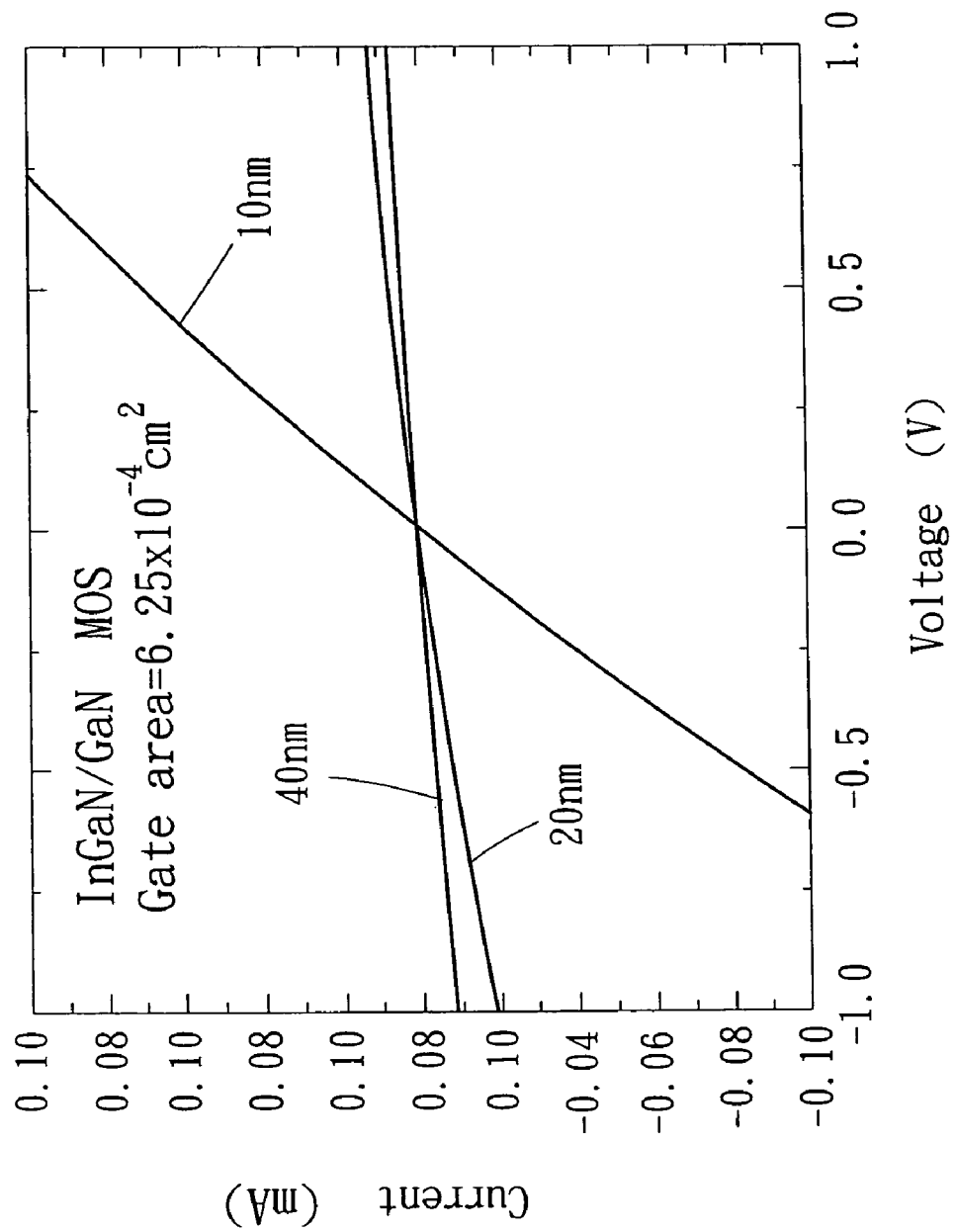
FIG. 5 is a chart of the second embodiment of the invention showing the relationship of the conductive tunneling current and voltage of a diode.

In a n-type InGaN/GaN structure, oxidize the surface of the n-type InGaN anodizing through photoelectric chemical process to form n-type $Ga_2O_3$ doping Indium (In) and Silicon (Si), and form a graded layer on the GaN junction. The relationship of the growth speed of $Ga_2O_3$ anodizing and pH value of electrolyte is shown in FIG. 4. For metal oxide semiconductor (MOS) diodes fabricated by means of the techniques set forth above, referring to FIG. 5, with the thickness of $Ga_2O_3$ at 40, 20 and 10 nm, the electric characteristics of the diode conductivity is transformed from Schottky barrier contact to an ohmic contact as the $Ga_2O_3$ becomes thinner.

Embodiment 3

Figure 6:
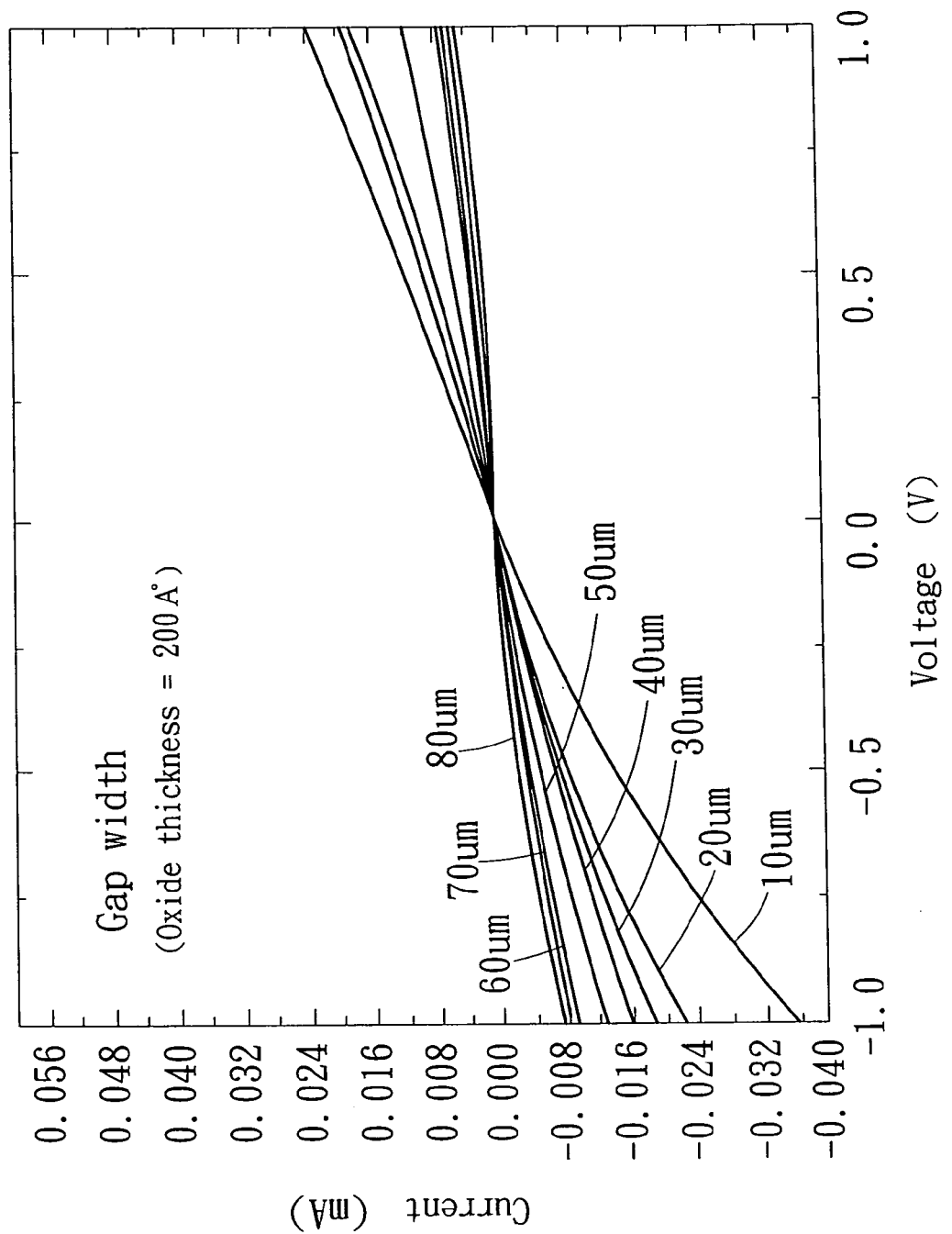
FIG. 6 is a chart of a third embodiment of the invention showing the relationship of the conductive current and voltage (I–V) of IGO transmission line of different gap width.
Figure 7:
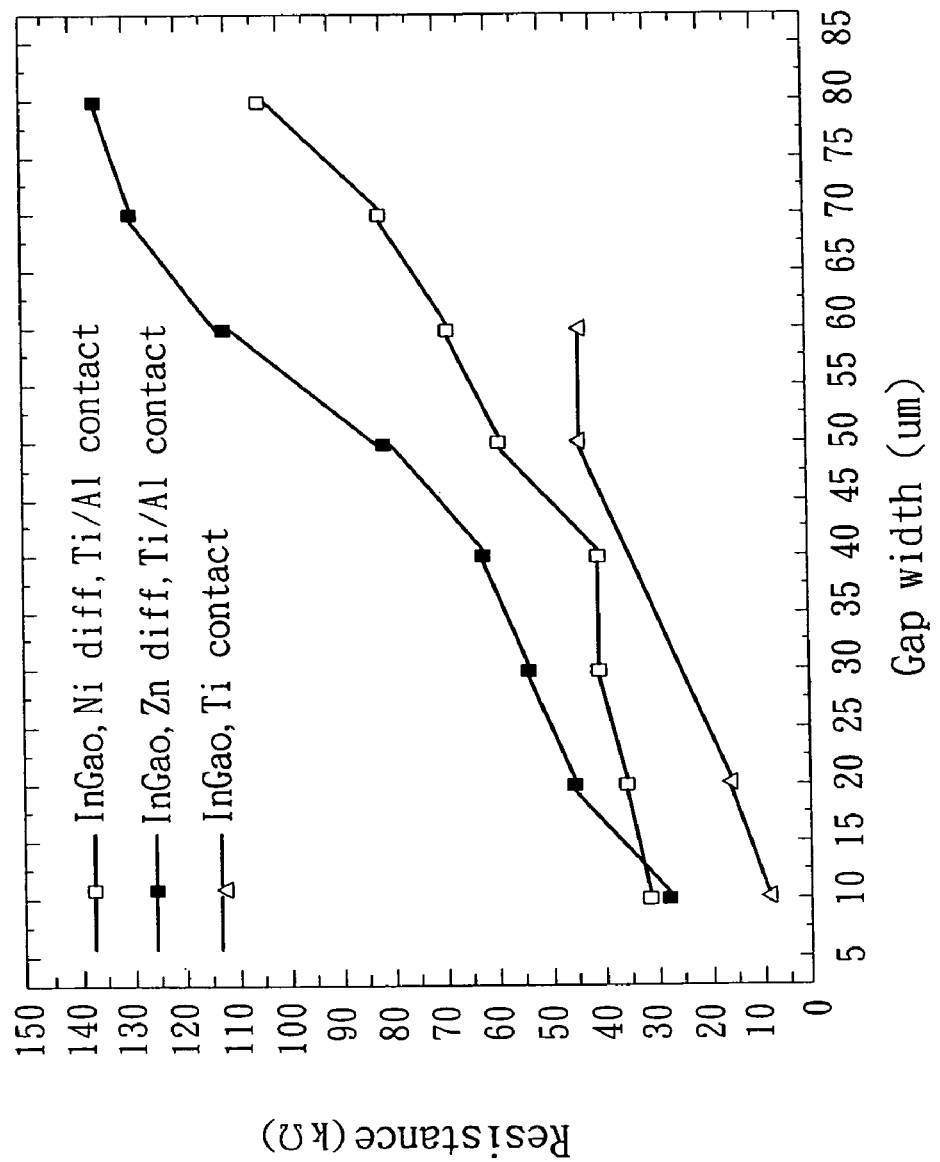
FIG. 7 is a chart of the third embodiment showing the relationship between IGO resistance and the transmission line of different gap width.

In an n-type InGaN/GaN structure, oxidize the surface of the n-type InGaN anodizing through photoelectric chemical process to form n-type $(InGa)_2O_3$ (IGO) and with a graded layer of GaON formed on the GaN junction. Use p-type mixture such as Ni or Zn to change the resistance of the n-type transparent conductive film. Place a circular transmission line pattern on the IGO, the relationship of current and voltage in the conditions of different gap widths is shown by the graphics (I–V) in FIG. 6. The results of the measured resistance is shown in FIG. 7. As shown in FIG. 7, the n-type IGO mixed with Ni and Zn has sheet resistance ($\rho_c$) increased from the original 0.0486 $\Omega$-cm² to 0.28 $\Omega$-cm² and 3.331 $\Omega$-cm².

What is claimed is:

1. A method for manufacturing gallium nitride (GaN) based transparent conductive oxidized film ohmic electrodes forming a transparent conductive film on a GaN layer, comprising steps of:
    (a) forming a GaN layer on the substrate;
    (b) forming the transparent conductive film of a high work function on a surface of the GaN layer;
    (c) forming a transparent conductive hetero-junction of opposite electric characteristics through an ion diffusion process on the transparent conductive film on the surface of the GaN layer; and
    (d) laying a metallic thick film on the transparent conductive hetero-junction for wiring process in later fabrication operations;
    wherein the ion diffusion process generates electron and hole tunneling effect to transform the transparent conductive hetero-junction to an ohmic contact electrode.

2. The method of claim 1, wherein the transparent conductive film of a high work function is formed by an oxide film selected from a group consisting of $Ga_2O_3$, $In_2O_3$, and $Al_2O_3$.

3. The method of claim 1, wherein the transparent conductive film (20) of a high work function is formed by combining $Ga_2O_3$, $In_2O_3$, and $Al_2O_3$.

4. The method of claim 1, wherein the ion diffusion process is accomplished by ion plantation or high temperature impurity diffusion.

5. The method of claim 1, wherein ions used in the ion diffusion process is a p-type mixture consisting of zinc (Zn), nickel (Ni), cobalt (Co), beryllium (Be), magnesium (Mg), calcium (Ca), strontium (Sr), barium (Ba), and silver (Ag).

6. The method of claim 1, wherein the metallic thick film is selectively formed of a monoxide film consisting of titanium (Ti), aluminum (Al), nickel (Ni) or gold (Au).

7. The method of claim 1, wherein the metallic thick film (30) is a combination of titanium (Ti), aluminum (Al), nickel (Ni) and gold (Au).

* * * * *